(12) United States Patent
King et al.

(10) Patent No.: US 6,271,778 B1
(45) Date of Patent: Aug. 7, 2001

(54) HIGH PASS FILTERING WITH AUTOMATIC PHASE EQUALIZATION

(75) Inventors: Eric T. King, Temple; Douglas F. Pastorello, Hudson, both of NH (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 09/483,826

(22) Filed: Jan. 15, 2000

(51) Int. Cl.[7] ....................................... H03M 1/48
(52) U.S. Cl. ........................... 341/111; 341/144; 327/555
(58) Field of Search ................................. 341/111, 144, 341/155, 143, 122, 141; 364/724.011; 327/555, 559, 565

(56) References Cited

U.S. PATENT DOCUMENTS 5,654,909 * 8/1997 Sun .............................. 364/724.011
5,892,833 * 4/1999 Maag et al. ............................. 381/98

* cited by examiner

Primary Examiner—Peguy JeanPierre
(74) Attorney, Agent, or Firm—David L. Stewart; Steven Lin

(57) ABSTRACT

A system and method for selectively providing high pass filtering of two digital signals that are to be subsequently combined. Each of the first and second signals is passed through one of a high pass filter, an all-pass filter and a module that performs substantially no signal filtering, where the phase and magnitude for either high pass filter are substantially equal to the phase and magnitude for either all-pass filter. At the minimum, the system provides the following filtering combinations for the respective first signal and second signal: (no filter, no filter), (high pass, high pass), (high pass, all-pass) and (all-pass, high-pass). Suitable first order high pass and corresponding all-pass filters are determined.

14 Claims, 4 Drawing Sheets

HIGH PASS FILTERING WITH AUTOMATIC PHASE EQUALIZATION

BACKGROUND OF THE INVENTION

1. Field of the Invention

This invention relates to programmable high pass filtering with automatic phase equalization for analog-to-digital conversion.

2. Description of the Related Art

Calculation of electrical signal energy consumed by an electrical load may be calculated as an integral over time, or as a sampling of values over time, of instantaneous power delivered or of the product of electrical current and voltage across the load. This calculated energy usually includes a contribution from the dc components in the circuit and a contribution of the remaining components. If one or more of the dc components is varying with time, a time varying error may arise in calculating the present value of energy consumed.

Other workers in this field have proposed various partial solutions for this problem. One such approach provides only ac coupling of the input signals—any dc coupling does not contribute to the computed value. A sensor employing ac coupling will cost more and will introduce phase shifts that will probably have to be (re)calibrated at regular time intervals. Further, inclusion of ac coupling will preclude use of this system by a user who wants or needs to sense dc signal values.

Other workers propose to dc couple the input signals, adding a high pass filter in one of the channels and compensating for phase with analog components. To improve the step response of the high pass filter and minimize settling time, poles of the filter(s) are placed as high in frequency as possible, consistent with avoidance of appreciable error in the magnitude response. This often introduces appreciable phase error at the desired signal frequencies, requiring additional phase error compensation with analog components. This compensation increases system cost and requires manual trimming of the analog components to specified values within the components' manufacturing tolerances.

What is needed is an array of high pass filters that can be inserted into, or removed from, the signal path(s) independently. Preferably, the system should provide greater user flexibility by allowing programmable use of high pass filters and should provide nearly perfect phase compensation of any phase error introduced by any high pass filter that is inserted. Preferably, this should be handled in the digital domain and should not require use of specially trimmed analog components.

SUMMARY OF THE INVENTION

These needs are met by the invention, which provides an array of high pass filters and a corresponding array of all-pass filters. If a high pass filter is inserted into one signal path, a corresponding all-pass filter is inserted into the other signal path for phase compensation. The high pass filter and its corresponding all-pass filter are constructed to have substantially the same magnitude response and substantially the same phase response for all frequencies greater than about 10 Hz.

DESCRIPTION OF BEST MODES OF THE INVENTION

Figure 1:
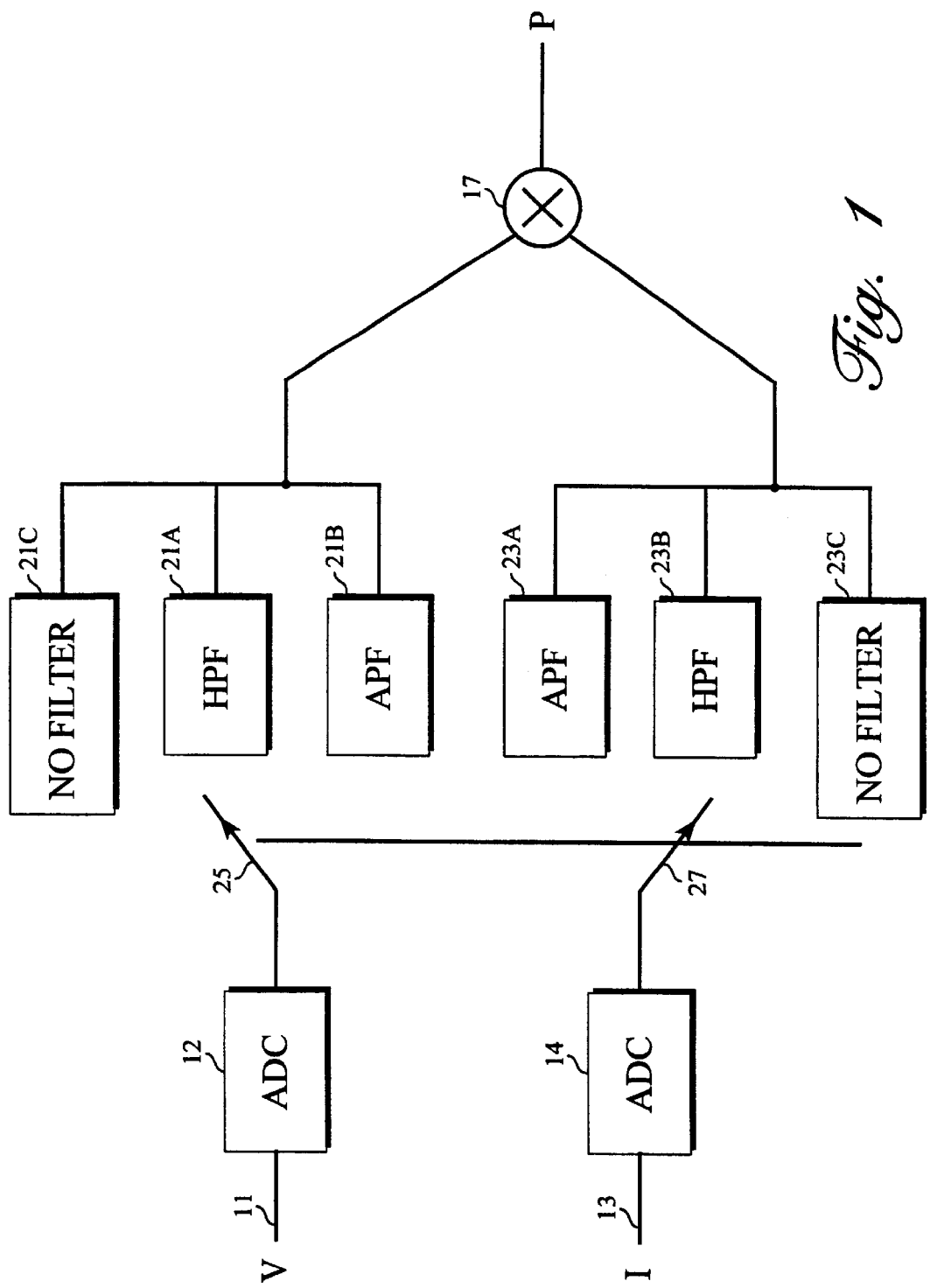
FIG. 1 illustrates one embodiment of the invention.

With reference to FIG. 1, the invention includes a first array of high pass filters and a second array of all-pass filters, with each all-pass filter providing substantially complete phase compensation for a corresponding high pass filter. A voltage sensing channel 11 and a current sensing channel 13 are passed through a filtering network 15 before being multiplied together by a multiplier module 17 to form a (filtered) instantaneous power signal P(t;F)=V(t;F)·I(t;F). Optionally, each of the channels carrying the voltage and current signals, V and I, includes an analog-to-digital converter (ADC), 12 and 14.

In one approach, the filtering network 15 includes: a high pass filtering module 21A, an all-pass filtering module 21B and a no-filter module 21C for the voltage signal V(t); a first filter switch 25 that switches the voltage signal through the high pass module 21A, though the all-pass module 21B, or through the no-filter module 21C; a high pass filtering module 23A, an all-pass filtering module 23B and a no-filter module for the current signal I(t), and a second filter switch 27 that switches the current signal through the high pass module 23A, through the all-pass module 23B or through the no-filter module 23C. The filtered voltage signal and current signal that emerge from the filtering network are denoted V(t;F) and I(t;F), respectively. Table 1 illustrates one suitable format of a pair ($V_{hpf}, I_{hpf}$) of coordinated programming commands to determine whether a given signal is passed through a high pass or all-pass filtering.

TABLE 1

Voltage And Current Filtering Commands.

| $V_{hpf}$ | $I_{hpf}$ | Voltage Filter | Current Filter |
|---|---|---|---|
| 0 | 0 | no-filter | no-filter |
| 0 | 1 | all-pass | high pass |
| 1 | 0 | high pass | all-pass |
| 1 | 1 | high pass | high pass |

In a first embodiment, each of the high pass filter and the all-pass filter is a first order filter having transfer functions of $$H_{hpf}(z) = K1(1+a)\{1-z^{-1}\}/\{1-a \cdot z^{-1}\} \quad (K1=0.5), \quad (1)$$

$$a = 511/512 \text{ or } 1023/1024, \quad (2)$$

$$H_{apf}(z) = K2\{b-z^{-1}\}/\{1-b \cdot z^{-1}\} \quad (K2=1), \quad (3)$$

$$b = 1023/1024 \text{ or } 2047/2048. \quad (4)$$

Figure 2:
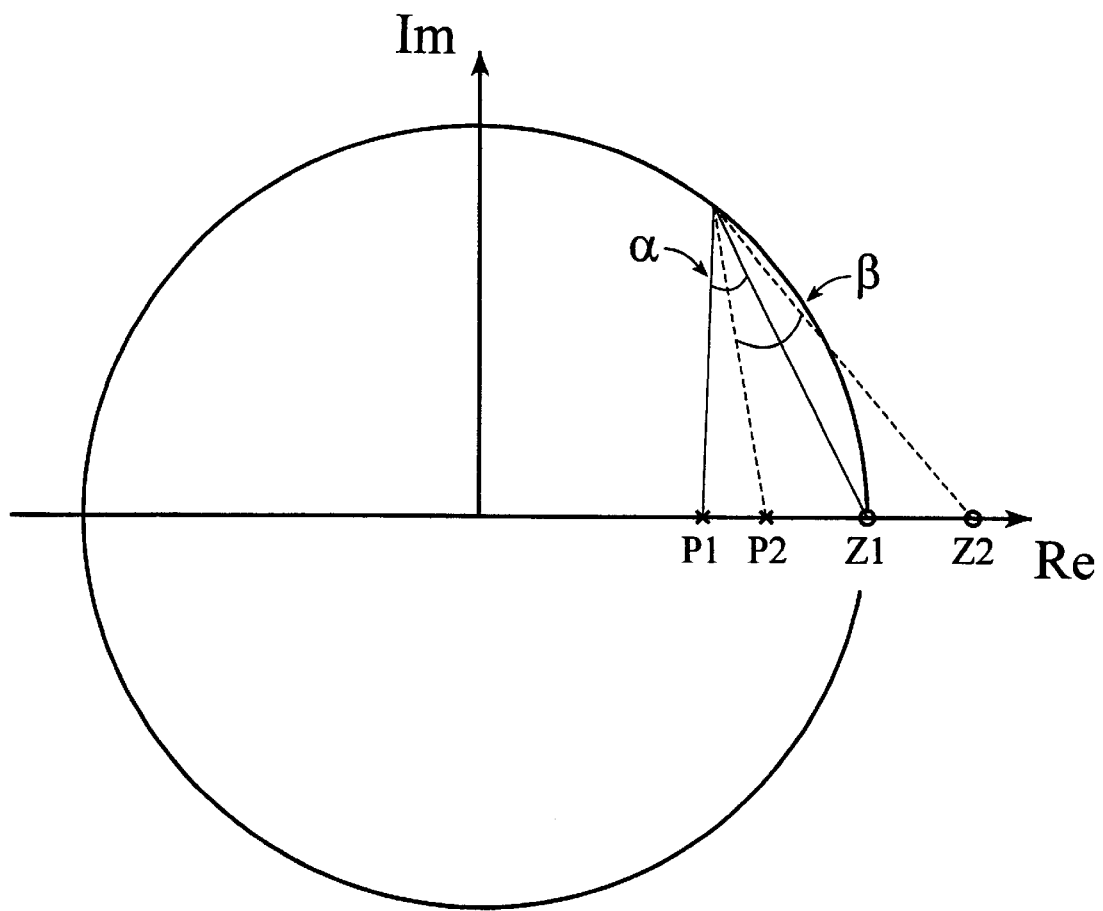
FIG. 2 graphically illustrates the positions of poles and zeroes in the complex plane for a particular high pass filter and all-pass filter used in the invention.

The high pass filter pole p1, the high pass filter zero z1, the all-pass filter pole p2 and the all-pass filter zero z2 are shown in FIG. 2 for these choices of the high pass and all-pass filters. The coefficients, a and b, are chosen so that, from any point on the unit circle in the complex plane, the subtended angle a, associated with p1 and z1, and the subtended angle β, associated with p2 and z2, are nearly indistinguishable so that the two filters can be phase matched. More generally, the coefficients a and b in the relations (1) and (3) can be chosen to satisfy a≈b.

The pole z=z1=a is moved toward z=1 until the lineband ripple is within the FIR specifications. This avoids the necessity for storing and using another set of compensation characteristics when the high pass filter is inserted into the signal path. One problem associated with moving the pole z=a closer to the point z=1 is an increase in signal settling time. However, this is not a serious concern here. The lineband ripple is within the FIR specifications for the choice a=1023/1024. An error in the energy result will occur, due to the (small) phase error at the line frequency. A phase error of 0.80 at 45 Hz will produce a representative proportional energy error of $1-\cos(0.8°)=0.01$ percent. A first order all-pass filter can compensate for this phase error almost completely.

Another problem here is that the dc gain of the AP filter is substantially −1. Because the HP channel has a dc gain of 0, the filter dc gain of −1 should not be a cause for concern in the energy calculation.

Figure 3:
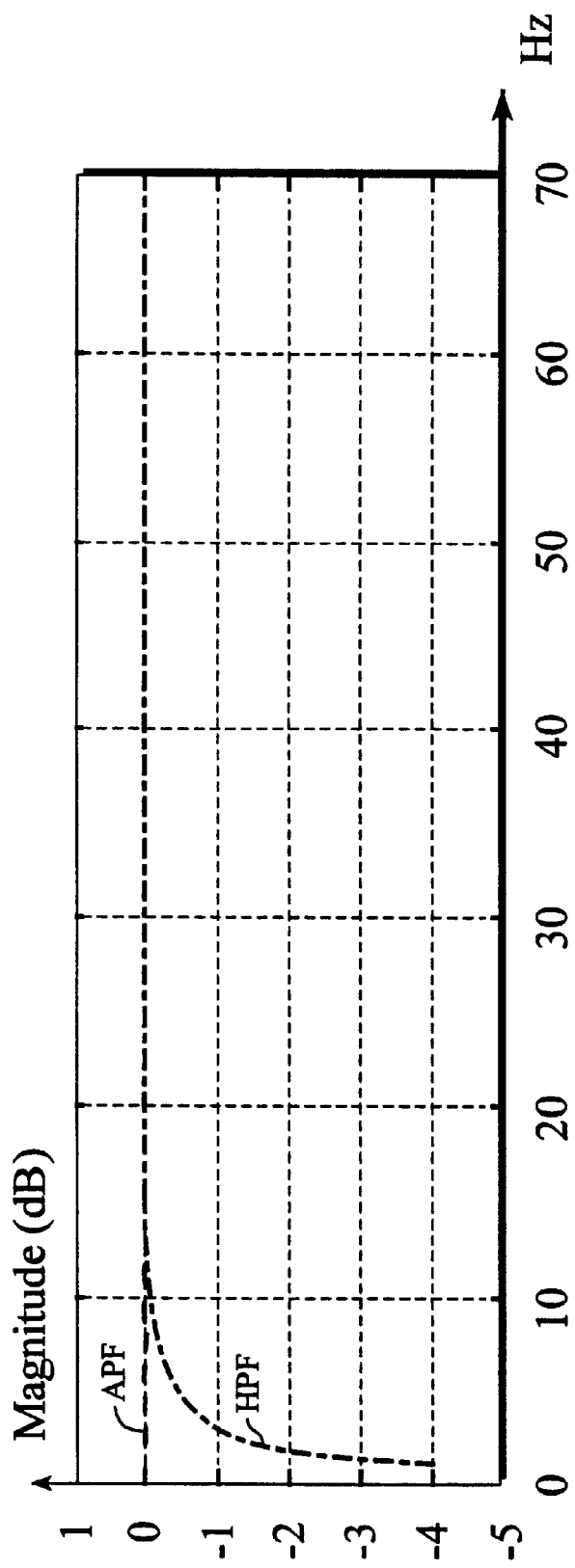
FIGS. 3 and 4 graphically compare the magnitudes and the phases, respectively, as a function of frequency for the particular filters used for FIG. 2.
Figure 4:
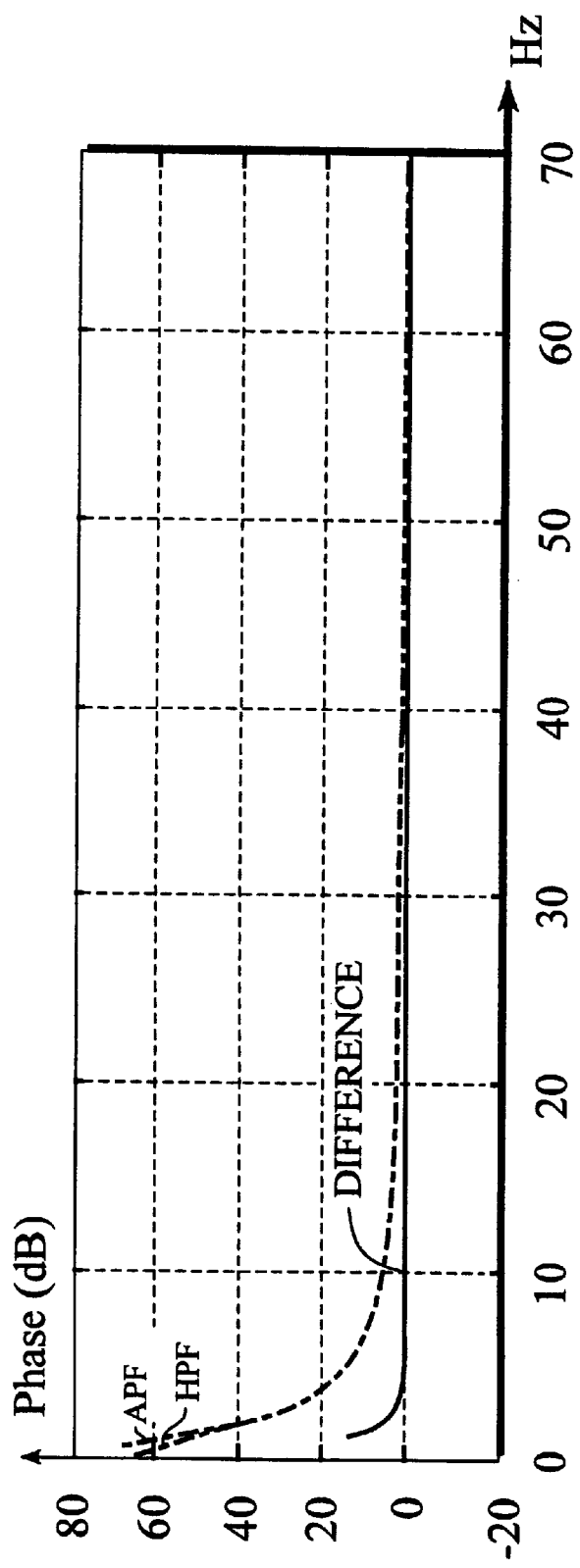

FIGS. 3 and 4 illustrate the magnitude response and phase response for the high pass and all-pass filters with the choices a=511/512 and b=1023/1024. For frequencies f>10 Hz, the high pass and all-pass filter magnitudes agree within 0.1 dB, the two phases are very close at intermediate frequencies, and these differences decrease monotonically toward zero for increasing frequencies.

When the same high pass filter is used on both the V channel and the I channel, the phase responses will be identical. When a high pass filter is used on one channel and the corresponding all-pass channel is used on the other channel, the phaes responses will be substantially identical, if the frequency used is greater than about 10 Hz.

Optionally, the filtered signals V(t;F) and I(t;F) can be multiplicatively combined and integrated to provide a measure of energy consumption $\epsilon$ over a time interval t1<t<t2, according to $$\varepsilon(t1; t2) = \int_{t1}^{t2} V(t; F) \cdot I(t; F) dt \tag{5A}$$

or $$\epsilon(t1; t2) = \Sigma V(t_n; F) \cdot I(t_n; F) \Delta t_n. \tag{5B}$$

The filtered first and second signals, V(t;F) and I(t;F) can also by used to form other combinations, such as convolutions, sums, differences and squares of the signals.

What is claimed is:

1. Apparatus for providing selective high pass filtering of two associated digital signals, the apparatus comprising:
   a first signal processing module that receives a first digital signal and passes the first signal through a first filtering module, through a second filtering module or through a third filtering module, depending upon the value of a switching command, to produce a first filtered signal;
   a second signal processing module that receives a second digital signal and passes the second signal through a fourth filtering module, through a fifth filtering module or through a sixth filtering module, depending upon the value of the switching command, to produce a second filtered signal; and
   wherein the first and fourth filtering modules comprise substantially identical high pass filters, the second and fifth filter modules comprise substantially identical all-pass filters, and the third and sixth filtering modules provide no filtering of a signal, and wherein the first and second signals may be passed through the following pairs of filter modules: first and fourth filter modules, second and fourth filter modules, first and fifth filter modules, and third and sixth filter modules.

2. The apparatus of claim 1, wherein each of said first filter module and said fourth filter module has substantially the following transfer function in the complex plane z: $H_1(z)=K1(1+a)\{(1-z^{-1})/\{1-a\cdot z^{-1}\}\}$, where the constant a is a real positive number that is less than, but close to, 1 and K1 is a selected real number.

3. The apparatus of claim 2, wherein each of said second filter module and said fifth filter module has substantially the following transfer function in the complex plane z: $H_2(z)=K2\{b-z^{-1}\}/\{1-b\cdot z^{-1}\}$, where said number a and the number b satisfy a≈b with 0<a<b≈1 and K2 is a selected real number.

4. The apparatus of claim 3, wherein said number a is selected from the group consisting of 511/512, 1023/1024 and 2047/2048.

5. The apparatus of claim 3, wherein said number b is selected from the group consisting of 1023/1024 and 2047/2048.

6. The apparatus of claim 1, further comprising a signal multiplier that receives said first and second filtered signals and computes a multiplicative product of the received signals at at least one sampling time.

7. The apparatus of claim 6, further comprising a signal integrator that receives said multiplicative product of said first and second filtered signals at at least first and second sampling times and computes a time integral of said multiplicative product between the first and second sampling times.

8. A method for providing selective high pass filtering of two associated digital signals, the method comprising:
   receiving a first digital signal and passing the first signal through a first filtering module, through a second filtering module or through a third filtering module, depending upon the value of a switching command, to produce a first filtered signal;
   receiving a second digital signal and passing the second signal through a fourth filtering module, through a fifth filtering module or through a sixth filtering module, depending upon the value of the switching command, to produce a second filtered signal; and
   providing the first and fourth filtering modules as substantially identical high pass filters, providing the second and fifth filter modules as substantially identical all-pass filters, and providing no filtering for a signal that passes through the third filtering module or the sixth filtering modules; and
   passing the first and second signals through one of the following pairs of filter modules: first and fourth filter modules, second and fourth filter modules, first and fifth filter modules, and third and sixth filter modules.

9. The method of claim 8, further comprising providing each of said first filter module and said fourth filter module with substantially the following transfer function in the complex plane z: $H_1(z)=K1(1+a)\{1-z^{-1}\}/\{1-a\cdot z^{-1}\}$, where the constant a is a real positive number that is less than, but close to, 1 and K1 is a selected real number.

10. The method of claim 9, further comprising providing each of said second filter module and said fifth filter module with substantially the following transfer function in the complex plane z: $H_2(z)=K2\{b-z^{-1}\}/\{1-b\cdot z^{-1}\}$, where said number a and the number b satisfy a≈b with 0<a<b≈< and K2 is a selected real number.

11. The method of claim 10, further comprising choosing said number a from the group consisting of 511/512, 1023/1024 and 2047/2048.

12. The method of claim 10, further comprising choosing said number b from the group consisting of 1023/1024 and 2047/2048.

13. The method of claim 8, further comprising receiving said first and second filtered signals and computing a multiplicative product of the received signals at at least one sampling time.

14. The method of claim 13, further comprising:
   receiving said first and second filtered signals and computing a multiplicative product of the received signals at at least first and second sampling time; and
   receiving said multiplicative product of said first and second filtered signals at at least the first and second sampling times and computing a time integral of said multiplicative product between the first and second sampling times.

* * * * *